(12) United States Patent
Tseng et al.

(10) Patent No.: US 9,209,403 B2
(45) Date of Patent: Dec. 8, 2015

(54) METHOD FOR FABRICATING FLEXIBLE ELECTRICAL DEVICES

(71) Applicant: INDUSTRIAL TECHNOLOGY RESEARCH INSTITUTE, Hsinchu County (TW)

(72) Inventors: Chi-Fu Tseng, Taipei (TW); Chyi-Ming Leu, Hsinchu County (TW); Hsueh-Yi Liao, Yonghe (TW); Yung-Lung Tseng, Zhubei (TW)

(73) Assignee: INDUSTRIAL TECHNOLOGY RESEARCH CENTER, Hsinchu County (TW)

( * ) Notice: Subject to any disclaimer, the term of this patent is extended or adjusted under 35 U.S.C. 154(b) by 64 days.

(21) Appl. No.: 13/912,172

(22) Filed: Jun. 6, 2013

(65) Prior Publication Data

US 2013/0267061 A1    Oct. 10, 2013

Related U.S. Application Data

(63) Continuation of application No. 12/824,220, filed on Jun. 27, 2010, now abandoned.

(30) Foreign Application Priority Data

Dec. 31, 2009  (TW) ............................... 98146298 A

(51) Int. Cl.
```
H01L 31/0392    (2006.01)
C08G 73/10      (2006.01)
H01L 51/00      (2006.01)
C08L 79/08      (2006.01)
```

(52) U.S. Cl.
CPC .......... *H01L 51/0035* (2013.01); *C08G 73/105* (2013.01); *C08G 73/1039* (2013.01); *C08G 73/1042* (2013.01); *C08G 73/1046* (2013.01); *C08G 73/1064* (2013.01); *C08G 73/1075* (2013.01); *C08G 73/1078* (2013.01); *C08L 79/08* (2013.01); *H01L 31/03926* (2013.01); *Y02E 10/50* (2013.01); *Y10T 428/10* (2015.01); *Y10T 428/31721* (2015.04)

(58) Field of Classification Search
CPC ..................... H01L 31/03296; C08G 73/1042; C08G 73/1046; C08G 73/105; C08G 73/1075
See application file for complete search history.

(56) References Cited

U.S. PATENT DOCUMENTS

| | | | |
|---|---|---|---|
| 6,788,449 B2 | 9/2004 | Liang et al. | |
| 6,962,756 B2 | 11/2005 | Kihara et al. | |
| 7,466,390 B2 | 12/2008 | French et al. | |
| 7,504,138 B2 | 3/2009 | Leu et al. | |
| 7,662,449 B2 | 2/2010 | Tyan et al. | |
| 2002/0006480 A1 | 1/2002 | Hisamitsu et al. | |
| 2006/0063908 A1 | 3/2006 | Moriuchi et al. | |
| 2007/0065603 A1 | 3/2007 | Leu et al. | |
| 2007/0116899 A1 | 5/2007 | Tyan et al. | |
| 2008/0113120 A1 | 5/2008 | Tyan et al. | |
| 2008/0286498 A1 | 11/2008 | Lin et al. | |
| 2009/0068482 A1 | 3/2009 | Bito et al. | |
| 2009/0136689 A1 | 5/2009 | Leu et al. | |
| 2010/0136263 A1 | 6/2010 | Leu et al. | |

FOREIGN PATENT DOCUMENTS

| | | | |
|---|---|---|---|
| CN | 1769978 A | 5/2006 | |
| JP | 2005338394 A | 12/2005 | |
| TW | 200821690 A | 5/2008 | |
| TW | 200844471 A1 | 11/2008 | |

OTHER PUBLICATIONS

Lim et al., "Flexible Organic Electroluminescent Devices Based on Fluorine-Containing Colorless Polyimide Substrates", Adv. Mater. 14, No. 18, Sep. 16, 2002.
Examination opinion issued by the Taiwan Intellectual Property Office on Nov. 11, 2011, for the above-referenced application's counterpart application in Taiwan (Application No. 098146298 filed Dec. 31, 2009).

*Primary Examiner* — Liam J Heincer
(74) *Attorney, Agent, or Firm* — Pai Patent & Trademark Law Firm; Chao-Chang David Pai

(57) ABSTRACT

A method for fabricating a flexible electrical device is provided. The method includes providing a first substrate, providing a second substrate opposed to the first substrate, wherein one of the first and second substrates includes a polyimide polymer of Formula (I)

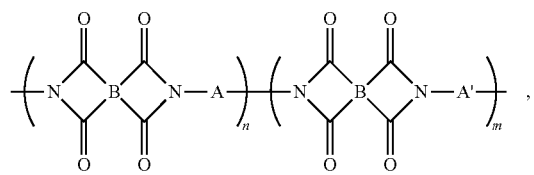

wherein B is a polycyclic aliphatic group, A is an aromatic group containing at least one ether bond, A' is an aromatic or aliphatic group, and 1≤n/m≤4, directly fabricating a thin film transistor (TFT) on one of the first and second substrates which includes the polyimide polymer of Formula (I), and disposing a medium layer between the first substrate and the second substrate.

6 Claims, No Drawings

METHOD FOR FABRICATING FLEXIBLE ELECTRICAL DEVICES

CROSS REFERENCE TO RELATED APPLICATIONS

This application is a Continuation of pending U.S. patent application Ser. No. 12/824,220, filed on Jun. 27, 2010, and entitled "Polyimide polymers for flexible electrical device substrate materials and flexible electrical devices comprising the same", which claims priority of Taiwan Patent Application No. 98146298, filed on Dec. 31, 2009, the entirety of which is incorporated by reference herein.

TECHNICAL FIELD

The technical field relates to a method for fabricating a flexible electrical device.

BACKGROUND

The applications of flexible displays have been valued. This technology is actively researched by various large global companies and the development of flexible display technology has progressively matured. The development of active flexible displays which can substitute for passive displays has become the focus of the technology. Development of a flexible display that is light, portable, rigid and flexible has become the new trend in next-generation displays. In the development of an active flexible display, providing a transparent substrate with high thermal resistance which is capable of enduring the TFT processes plays an important role.

While a transparent substrate material is applied in flexible flat panel display fabrication, it must be capable of enduring the TFT processes. For example, TFT processes may include high-temperature processes (>200° C.), a washing processes and chemical erosion from etching and a development processes. Thus, performing chemical structure modifications or specific processes on present flexible transparent plastic film material with high glass transition temperature (Tg) to achieve high thermal resistance (300° C.) and dimensional stability is desirable. Additionally, while the plastic material is coated on a glass substrate to form a film, forming a tensile film possessing high chemical resistance capable of enduring the TFT plating and etching processes of the flexible flat panel display fabrication is required. Development of such flexible plastic film material with the aforesaid characteristics is desirable.

A conventional polyimide plastic substrate with high thermal resistance can be directly coated on a glass and can endure processing temperatures exceeding 200° C., and thus achieves dimensional stability. However, such polyimide substrate is yellow.

SUMMARY

One embodiment of the disclosure provides a polyimide polymer for flexible electrical device substrate material, of Formula (I):

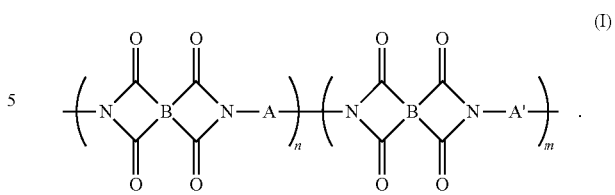

In Formula (I), B is a polycyclic aliphatic group, A is an aromatic group containing at least one ether bond, A' is an aromatic or aliphatic group, and $1 \leq n/m \leq 4$.

One embodiment of the disclosure provides a flexible electrical device comprising a first substrate, a second substrate opposed to the first substrate, wherein one of the first and second substrates comprises a polyimide polymer of Formula (I), and a medium layer disposed between the first substrate and the second substrate.

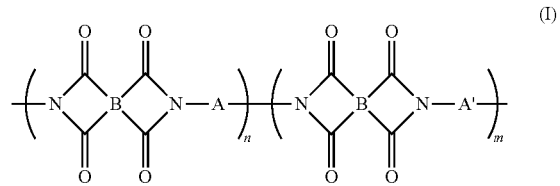

In Formula (I), B is a polycyclic aliphatic group, A is an aromatic group containing at least one ether bond, A' is an aromatic or aliphatic group, and $1 \leq n/m \leq 4$.

One embodiment of the disclosure provides a method for fabricating a flexible electrical device comprising providing a first substrate, providing a second substrate opposed to the first substrate, wherein one of the first and second substrates comprises a polyimide polymer of Formula (I), directly fabricating a thin film transistor (TFT) on one of the first and second substrates which comprises the polyimide polymer of Formula (I), and disposing a medium layer between the first substrate and the second substrate.

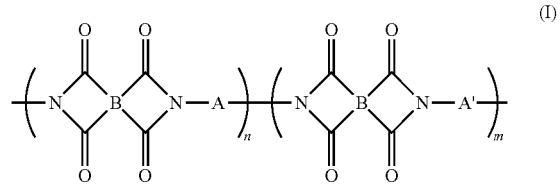

In Formula (I), B is a polycyclic aliphatic group, A is an aromatic group containing at least one ether bond, A' is an aromatic or aliphatic group, and $1 \leq n/m \leq 4$.

The disclosure provides a soluble polyimide polymer (film) which is colorless, has high transparency, high thermal resistance, is high flexibility and is suitable for application in flexible flat panel display fabrication using existing equipment. Polycyclic aliphatic dianhydride, aromatic diamine and diamine containing ether bonds are copolymerized under a high temperature with a specific ratio to form a soluble polyimide solution. The polyimide solution is then coated on a glass substrate to form a film. The tensile film possesses highly chemically resistant and endures the TFT plating and etching processes during flexible flat panel display fabrication. It is also highly thermally resistant (Tg>300° C.) and it has a high chemical resistance (capable of resisting photoresist, oxalic acid, developer and stripper).

A detailed description is given in the following embodiments.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

One embodiment of the disclosure provides a polyimide polymer for flexible electrical device substrate material, of Formula (I):

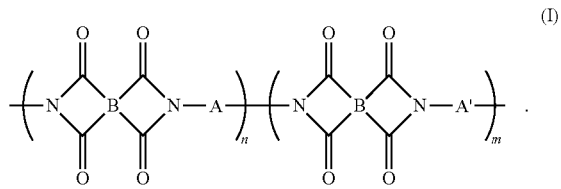

(I)

In Formula (I), B may be a polycyclic aliphatic group, for example:

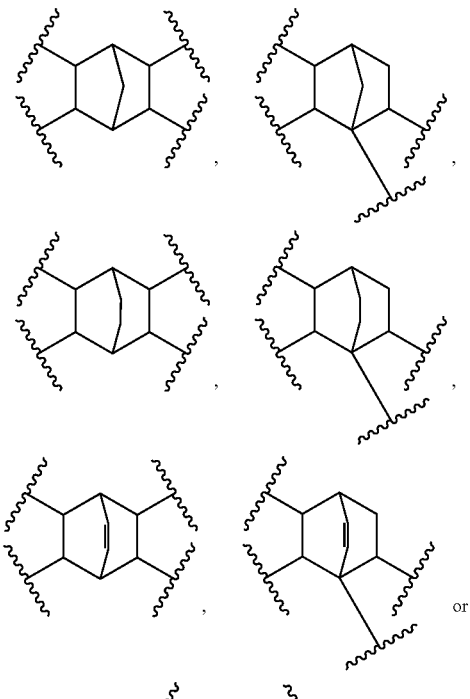

A may be an aromatic group containing at least one ether bond, for example:

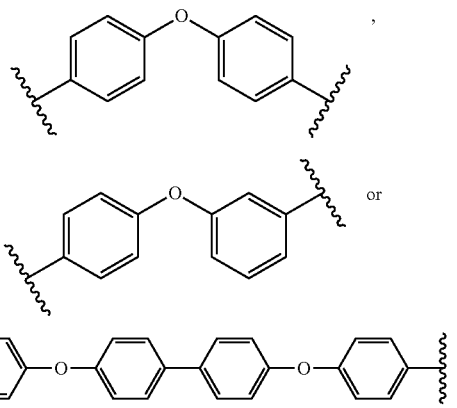

A' may be an aromatic or aliphatic group, for example:

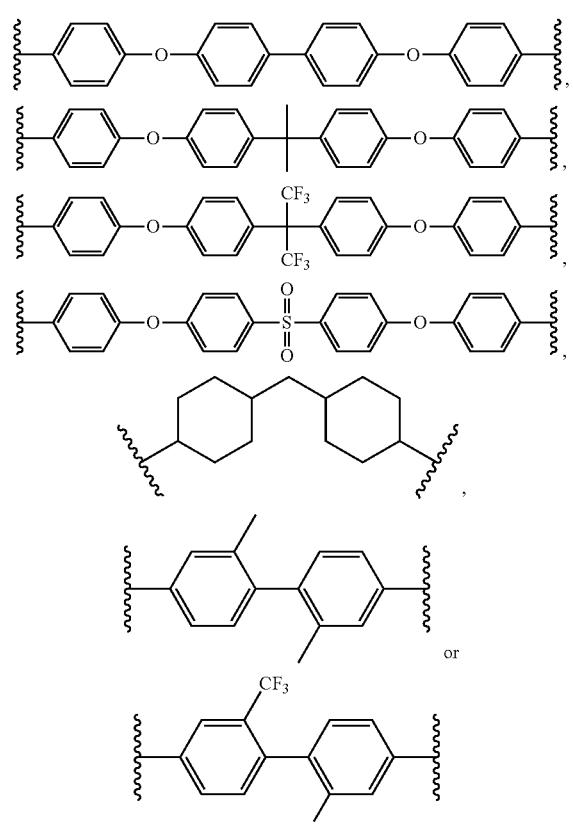

$1 \leq n/m \leq 4$.

One embodiment of the disclosure provides a flexible electrical device comprising a first substrate, a second substrate and a medium layer. The first substrate is opposed to the second substrate. One of the first and second substrates comprises a polyimide polymer of Formula (I). The medium layer is disposed between the first substrate and the second substrate.

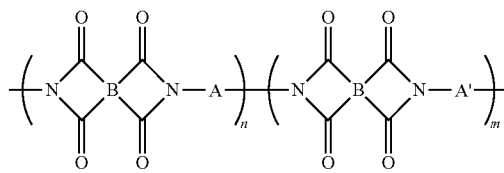

In Formula (I), B may be a polycyclic aliphatic group, for example:

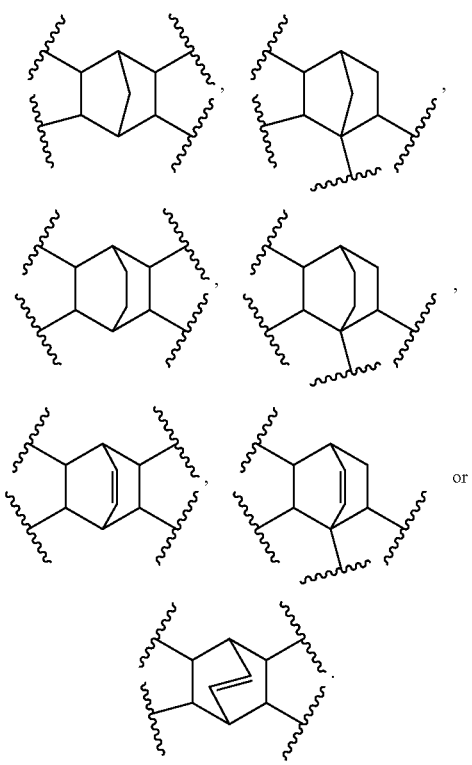

A may be an aromatic group containing at least one ether bond, for example:

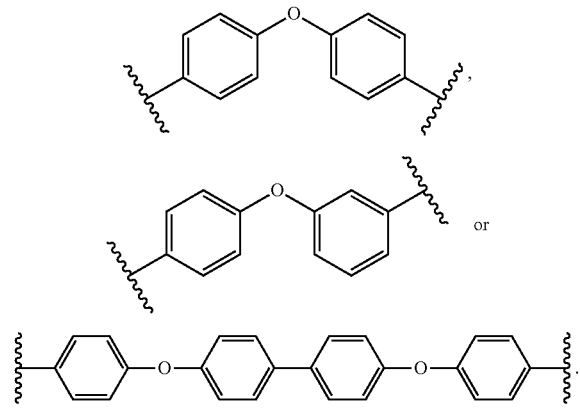

A' may be an aromatic or aliphatic group, for example:

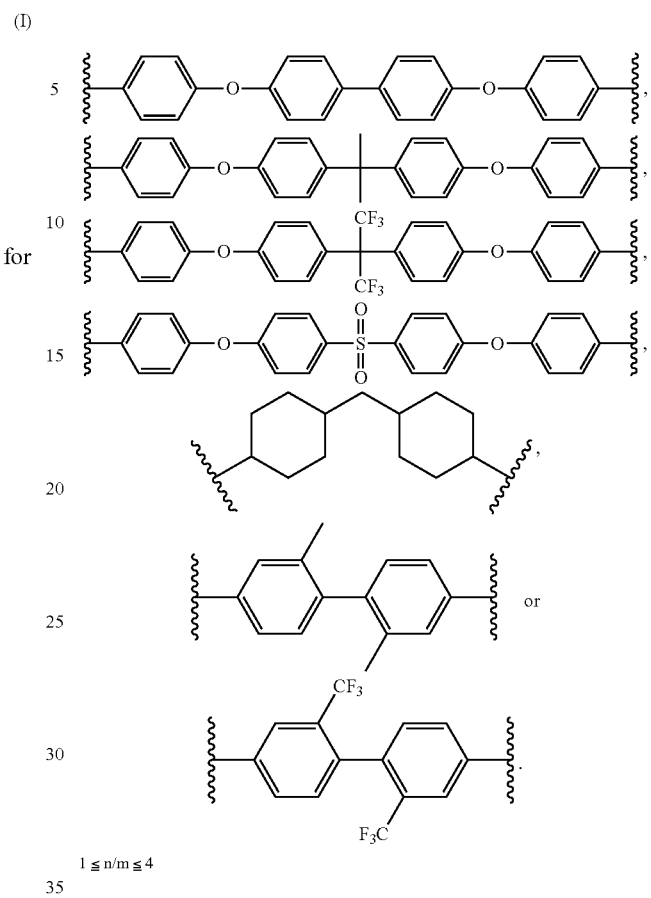

$1 \leq n/m \leq 4$

The medium layer may comprise liquid crystal, microcapsule electrophoresis or a polymer, for example; nematic liquid crystal, smectic liquid crystal, cholesteric liquid crystal, E-ink, fluorescent small molecule or fluorescent polymer.

The disclosed flexible electrical device may comprise a particle display, liquid crystal display or micro electro mechanical system (MEMS) display. The particle display may comprise an electrochromic display (ECD) or electrophoretic display (EPD). The liquid crystal display may comprise cholesteric liquid crystal display (ChLCD) or a bistable twisted-nematic (TN) liquid crystal display.

The disclosed flexible electrical device may further comprise a solar cell.

One embodiment of the disclosure provides a method for fabricating a flexible electrical device comprising the following steps. A first substrate is provided. A second substrate opposed to the first substrate is provided. One of the first and second substrates comprises a polyimide polymer of Formula (I). Next, a thin film transistor (TFT) is directly fabricated on one of the first and second substrates which comprises the polyimide polymer of Formula (I). A medium layer is disposed between the first substrate and the second substrate.

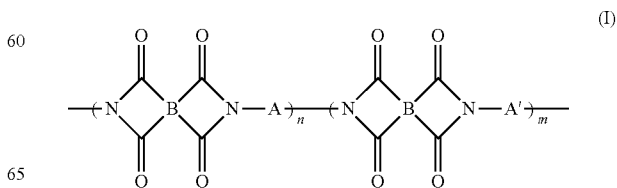

In Formula (I), B may be a polycyclic aliphatic group, for example:

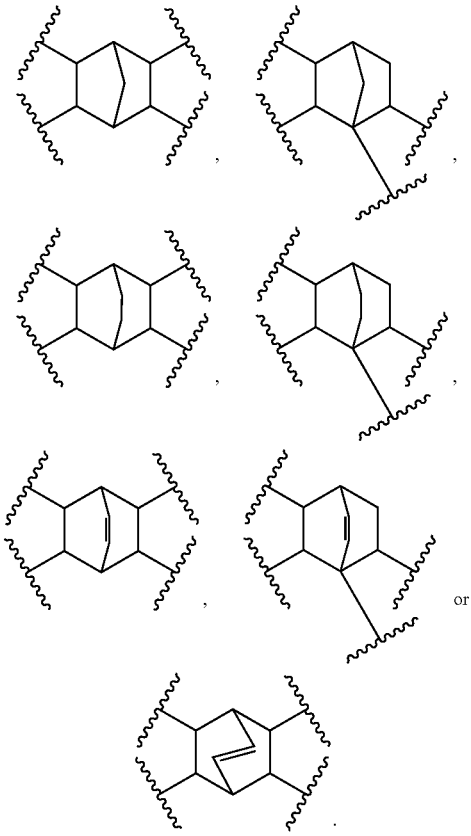

A may be an aromatic group containing at least one ether bond, for example:

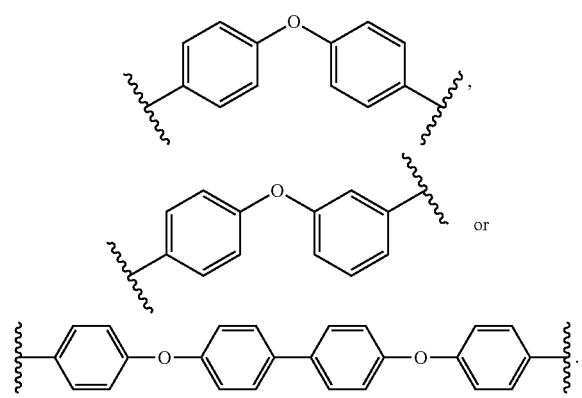

A' may be an aromatic or aliphatic group, for example:

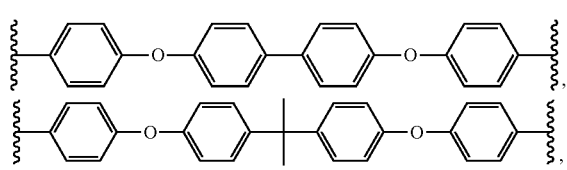

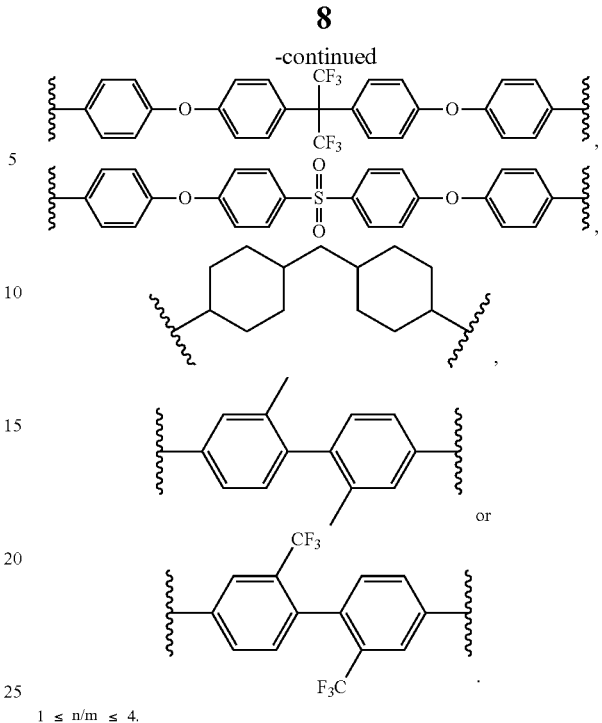

$1 \leq n/m \leq 4$.

The medium layer may comprise liquid crystal, microcapsule electrophoresis or a polymer, for example; nematic liquid crystal, smectic liquid crystal, cholesteric liquid crystal, E-ink, fluorescent small molecule or fluorescent polymer.

The disclosed flexible electrical device may comprise a particle display, liquid crystal display or micro electro mechanical system (MEMS) display. The particle display may comprise an electrochromic display (ECD) or electrophoretic display (EPD). The liquid crystal display may comprise cholesteric liquid crystal display (ChLCD) or a bistable twisted-nematic (TN) liquid crystal display.

The disclosed flexible electrical device may further comprise a solar cell.

The disclosure provides a soluble polyimide polymer (film) which is colorless, highly transparent, has a high thermal resistance and is highly flexible, and is suitable for application for flexible flat panel display fabrication using existing equipment. Polycyclic aliphatic dianhydride, aromatic diamine and diamine containing ether bonds are copolymerized under high temperature with a specific ratio to form a soluble polyimide solution. The polyimide solution is then coated on a glass substrate to form a film. The tensile film possesses high chemical resistance and endures the TFT plating and etching processes of flexible flat panel display fabrication, with high thermal resistance (Tg>300° C.) and high chemical resistance (capable of resisting photoresist, oxalic acid, developer and stripper).

EXAMPLES

The disclosed polyimide polymer possesses high thermal resistance and a low coefficient of thermal expansion (CTE). The polycyclic aliphatic dianhydride improves the solubility of the polymer solution. The aromatic diamine or diamine containing ether bond improves chemical resistance. The aromatic diamine (for example

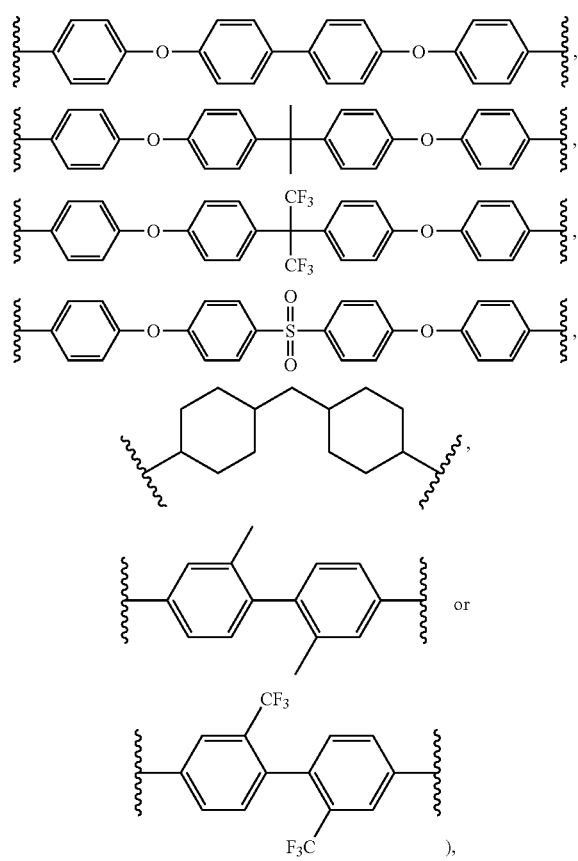

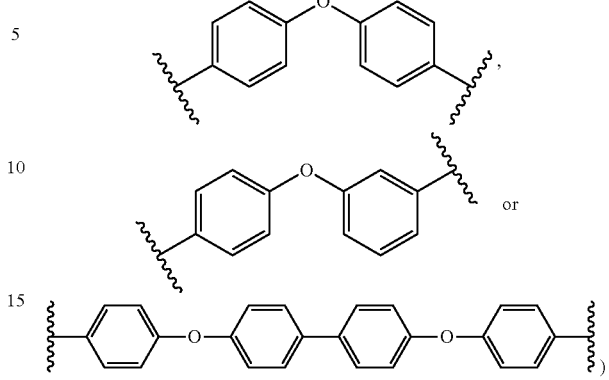

diamine containing ether bond (for example and polycyclic aliphatic dianhydride are copolymerized with a specific ratio to form a soluble polyimide solution. The polyimide solution is then coated on a glass substrate to form a film. The film possesses high transparency, is colorless, is highly thermally resistant, (Tg>300° C.), high flexibility and has a high chemical resistance (capable of resisting photoresist, oxalic acid, developer and stripper).

The polyimide is synthesized by polycondensation, which is disclosed as follows. One method is that diamine monomer and dianhydride monomer are reacted in a polar solvent to form a poly (amic acid) (PAA) (precursor of polyimide). PAA is then thermally imidized (300 to 400° C.) or chemically imidized to dehydrate to form polyimide. The other method involves reacting a diamine monomer and dianhydride monomer in a phenolic solvent (for example m-cresol or Cl-phenol). After heating to reflux temperature, the polyimide is then prepared.

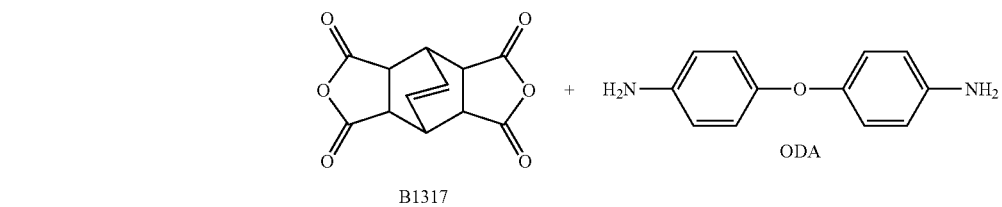

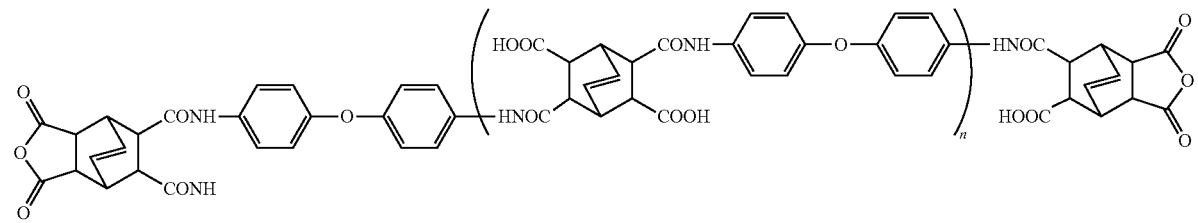

poly(amic acid)

thermal or
chemical
imidization

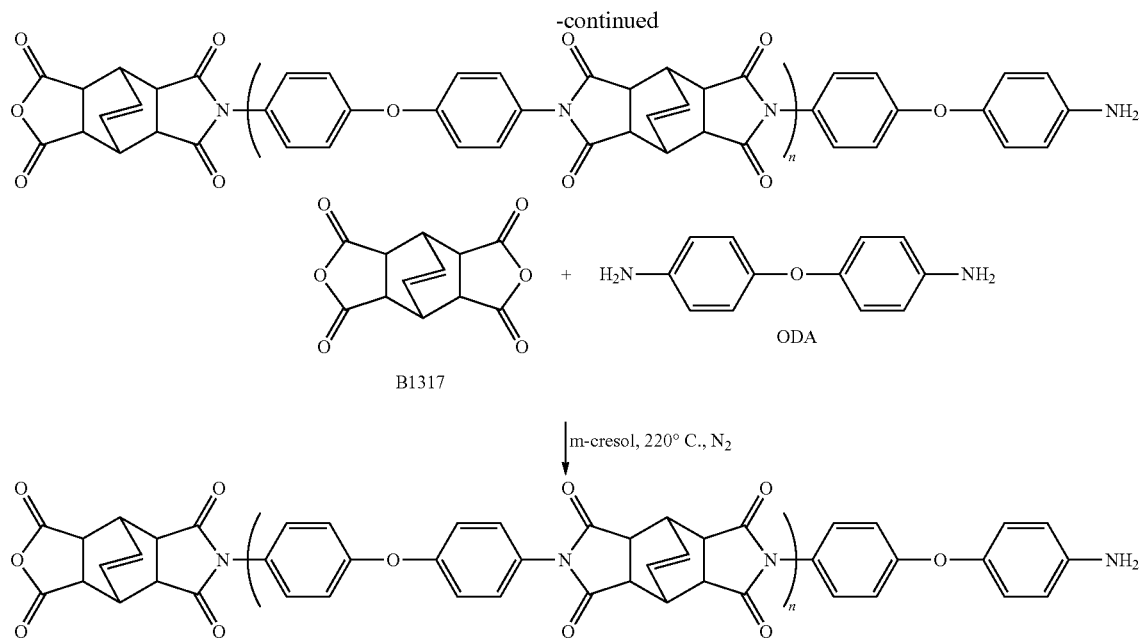

Example 1

Preparation of B1317-BAPB(0.3)-BAPPm(0.7)

0.0103 mole of BAPPm

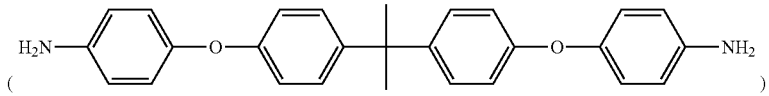

and 0.0044 mole of BAPB

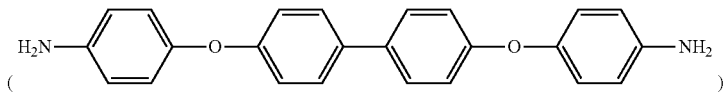 [SMILES: Nc1ccc(Oc2ccc(-c3ccc(Oc4ccc(N)cc4)cc3)cc2)cc1]

were completely dissolved in 38.29 g of m-cresol in a three-necked flask under nitrogen at room temperature. 0.0150 mole of B1317 dianhydride

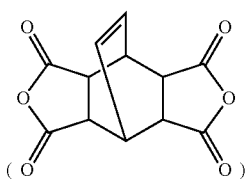 [SMILES: O=C1OC(=O)C2C3C=CC(C12)C1C(=O)OC(=O)C31]

was then added to the flask. After B1317 was completely dissolved, the resulting solution was continuously stirred for 1 hour to form a sticky poly(amic acid) (PAA) solution. Next, the PAA solution was heated to 220° C. to react for 3 hours. Water was simultaneously removed using a water remover during the aforesaid processes.

Example 2

Preparation of B1317-BAPB(0.5)-BAPPm(0.5)

0.0074 mole of BAPPm

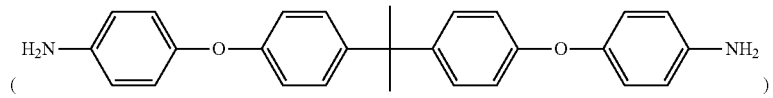

and 0.0074 mole of BAPB

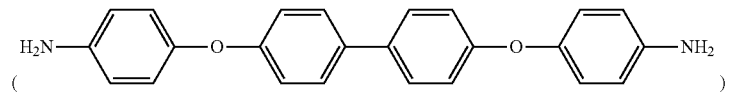 [SMILES: Nc1ccc(Oc2ccc(-c3ccc(Oc4ccc(N)cc4)cc3)cc2)cc1]

were completely dissolved in 46.62 g of m-cresol in a three-necked flask under nitrogen at room temperature. 0.0150 mole of B1317 dianhydride

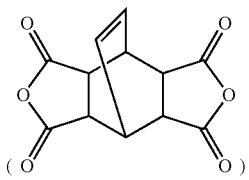

was then added to the flask. After B1317 was completely dissolved, the resulting solution was continuously stirred for 1 hour to form a sticky poly(amic acid) (PAA) solution. Next, the PAA solution was heated to 220° C. to react for 3 hours. Water was simultaneously removed using a water remover during the aforesaid processes. Next, the reaction solution was dropped into methanol to precipitate silk polyimide. The polyimide was then baked in a vacuum oven for 12 hours. The silk polyimide was then dissolved in DMAc, with a solid content of 15%.

Example 3

Preparation of B1317-BAPB(0.7)-BAPPm(0.3)

0.0044 mole of BAPPm

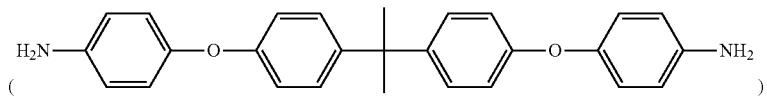

and 0.0103 mole of BAPB

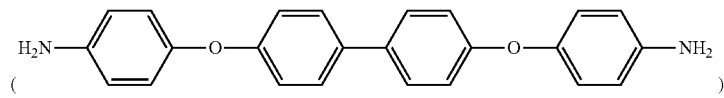 [SMILES: Nc1ccc(Oc2ccc(-c3ccc(Oc4ccc(N)cc4)cc3)cc2)cc1]

were completely dissolved in 35.08 g of m-cresol in a three-necked flask under nitrogen at room temperature. 0.0150 mole of B1317 dianhydride was then added to the flask. After B1317 was completely dissolved, the resulting solution was continuously stirred for 1 hour to form a sticky poly(amic acid) (PAA) solution. Next, the PAA solution was heated to 220° C. to react for 3 hours. Water was simultaneously removed using a water remover during the aforesaid processes. Next, the reaction solution was dropped into methanol to precipitate silk polyimide. The polyimide was then baked in a vacuum oven for 12 hours. The silk polyimide was then dissolved in DMAc, with a solid content of 15%.

Example 4

Preparation of B1317-BAPB(0.8)-BAPPm(0.2)

0.0029 mole of BAPPm

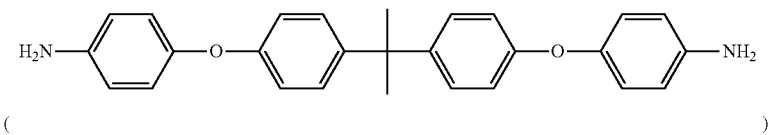 [SMILES: CC(C)(c1ccc(Oc2ccc(N)cc2)cc1)c1ccc(Oc2ccc(N)cc2)cc1]

and 0.0118 mole of BAPB

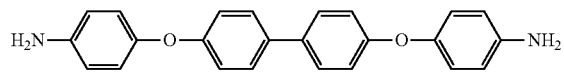

( )

were completely dissolved in 37.05 g of m-cresol in a three-necked flask under nitrogen at room temperature. 0.0150 mole of B1317 dianhydride

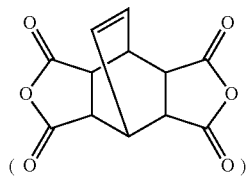

( )

was then added to the flask. After B1317 was completely dissolved, the resulting solution was continuously stirred for 1 hour to form a sticky poly(amic acid) (PAA) solution. Next, the PAA solution was heated to 220° C. to react for 3 hours. Water was simultaneously removed using a water remover during the aforesaid processes. Next, the reaction solution was dropped into methanol to precipitate silk polyimide. The polyimide was then baked in a vacuum oven for 12 hours. The silk polyimide was then dissolved in DMAc, with a solid content of 15%.

Example 5

Preparation of B1317-BAPB(0.9)-BAPPm(0.1)

0.0015 mole of BAPPm

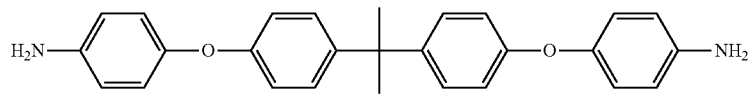

( )

and 0.0132 mole of BAPB

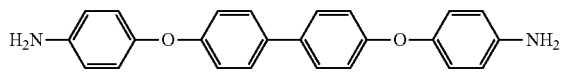

( )

were completely dissolved in 38.79 g of m-cresol in a three-necked flask under nitrogen at room temperature. 0.0150 mole of B1317 dianhydride

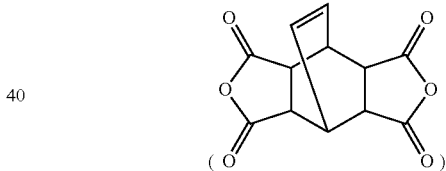

was then added to the flask. After B1317 was completely dissolved, the resulting solution was continuously stirred for 1 hour to form a sticky poly(amic acid) (PAA) solution. Next, the PAA solution was heated to 220° C. to react for 3 hours. Water was simultaneously removed using a water remover during the aforesaid processes.

TABLE 1

| | Compositions | | | | Solvent utilized in TFT processes | | | |
|---|---|---|---|---|---|---|---|---|
| Example | B1317 | BAPB | BAPPm | solubility | Photoresist | Oxalic acid | Developer | Stripper |
| 1 | 1 | 0.3 | 0.7 | X | — | — | — | — |
| 2 | 1 | 0.5 | 0.5 | ○ | ○ | ○ | ○ | ○ |
| 3 | 1 | 0.7 | 0.3 | ○ | ○ | ○ | ○ | ○ |
| 4 | 1 | 0.8 | 0.2 | ○ | ○ | ○ | ○ | ○ |
| 5 | 1 | 0.9 | 0.1 | X | — | — | — | — |

The disclosed polyimide synthesized by diamine (BAPB and BAPPm with various ratios) and polycyclic aliphatic dianhydride (B1317) prepared from Examples 1 to 5 was further coated on a glass to form a polyimide film. Table 1 shows the solubility of the polyimide with various compositions and the test results of the chemical resistance of the polyimide to the solvent utilized in TFT processes (test condition: 50° C./1 hour).

Example 6

Preparation of B1317-ODA(0.3)-BAPPm(0.7)

0.0103 mole of BAPPm

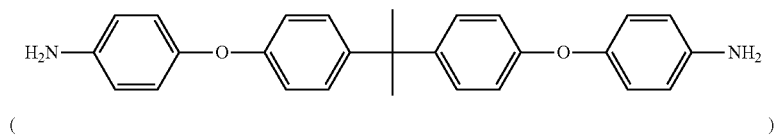

( )

and 0.0044 mole of ODA

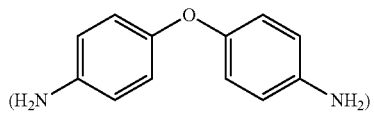

($H_2N$                    $NH_2$)

were completely dissolved in 35.29g of m-cresol in a three-necked flask under nitrogen at room temperature. 0.0150 mole of B1317 dianhydride

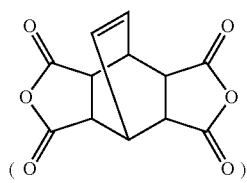

( )

was then added to the flask. After B1317 was completely dissolved, the resulting solution was continuously stirred for 1 hour to form a sticky poly(amic acid) (PAA) solution. Next, the PAA solution was heated to 220° C. to react for 3 hours. Water was simultaneously removed using a water remover during the aforesaid processes.

Example 7

Preparation of B1317-ODA(0.5)-BAPPm(0.5)

0.0074 mole of BAPPm

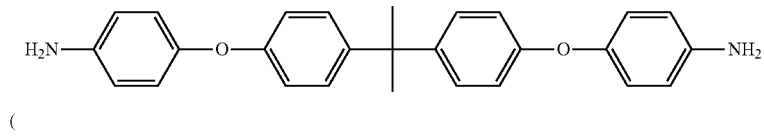

( )

and 0.0074 mole of ODA

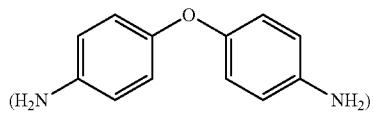

($H_2N$                    $NH_2$)

were completely dissolved in 32.97 g of m-cresol in a three-necked flask under nitrogen at room temperature. 0.0150 mole of B1317 dianhydride

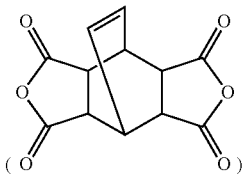

( )

was then added to the flask. After B1317 was completely dissolved, the resulting solution was continuously stirred for 1 hour to form a sticky poly(amic acid) (PAA) solution. Next, the PAA solution was heated to 220° C. to react for 3 hours. Water was simultaneously removed using a water remover during the aforesaid processes. Next, the reaction solution was dropped into methanol to precipitate silk polyimide. The polyimide was then baked in a vacuum oven for 12 hours. The silk polyimide was then dissolved in DMAc, with a solid content of 15%.

Example 8

Preparation of B1317-ODA(0.7)-BAPPm(0.3)

0.0044 mole of BAPPm

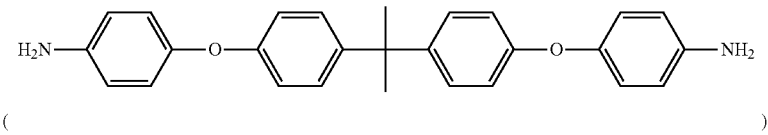

and 0.0103 mole of ODA

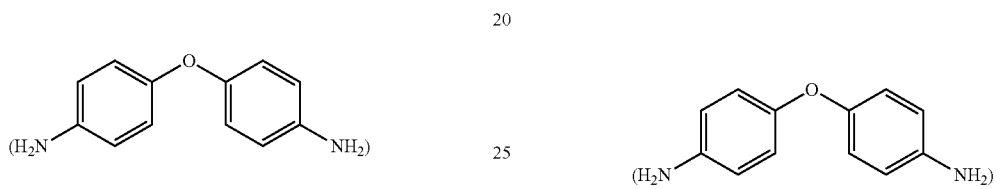

were completely dissolved in 30.38 g of m-cresol in a three-necked flask under nitrogen at room temperature. 0.0150 mole of B1317 dianhydride

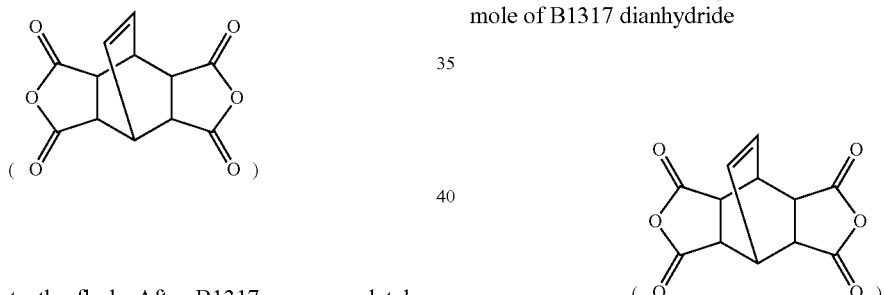

was then added to the flask. After B1317 was completely dissolved, the resulting solution was continuously stirred for 1 hour to form a sticky poly(amic acid) (PAA) solution. Next, the PAA solution was heated to 220° C. to react for 3 hours. Water was simultaneously removed using a water remover during the aforesaid processes. Next, the reaction solution was dropped into methanol to precipitate silk polyimide. The polyimide was then baked in a vacuum oven for 12 hours. The silk polyimide was then dissolved in DMAc, with a solid content of 15%.

Example 9

Preparation of B1317-ODA(0.8)-BAPPm(0.2)

0.0029 mole of BAPPm

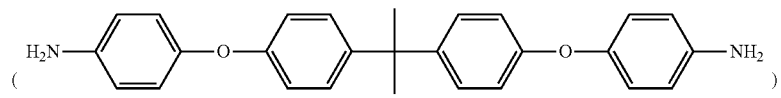

and 0.0118 mole of ODA were completely dissolved in 29.11 g of m-cresol in a three-necked flask under nitrogen at room temperature. 0.0150 mole of B1317 dianhydride was then added to the flask. After B1317 was completely dissolved, the resulting solution was continuously stirred for 1 hour to form a sticky poly(amic acid) (PAA) solution. Next, the PAA solution was heated to 220° C. to react for 3 hours. Water was simultaneously removed using a water remover during the aforesaid processes. Next, the reaction solution was dropped into methanol to precipitate silk polyimide. The polyimide was then baked in a vacuum oven for 12 hours. The silk polyimide was then dissolved in DMAc, with a solid content of 15%.

Example 10

Preparation of B1317-ODA(0.9)-BAPPm(0.1)

0.0015 mole of BAPPm

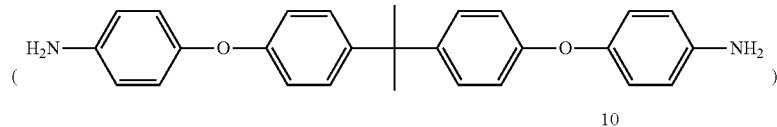

and 0.0132 mole of ODA

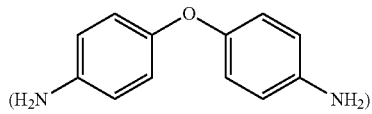

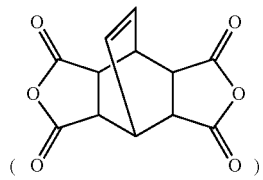

were completely dissolved in 27.93 g of m-cresol in a three-necked flask under nitrogen at room temperature. 0.0150 mole of B1317 dianhydride was then added to the flask. After B1317 was completely dissolved, the resulting solution was continuously stirred for 1 hour to form a sticky poly(amic acid) (PAA) solution. Next, the PAA solution was heated to 220° C. to react for 3 hours. Water was simultaneously removed using a water remover during the aforesaid processes.

TABLE 2

| | Compositions | | | | Solvent utilized in TFT processes | | | |
|---|---|---|---|---|---|---|---|---|
| Example | B1317 | ODA | BAPPm | solubility | Photoresist | Oxalic acid | Developer | Stripper |
| 6 | 1 | 0.3 | 0.7 | X | — | — | — | — |
| 7 | 1 | 0.5 | 0.5 | ○ | ○ | ○ | ○ | ○ |
| 8 | 1 | 0.7 | 0.3 | ○ | ○ | ○ | ○ | ○ |
| 9 | 1 | 0.8 | 0.2 | ○ | ○ | ○ | ○ | ○ |
| 10 | 1 | 0.9 | 0.1 | X | — | — | — | — |

The disclosed polyimide synthesized by diamine (ODA and BAPPm with various ratios) and polycyclic aliphatic dianhydride (B1317) prepared from Examples 6 to 10 was further coated on a glass to form a polyimide film. Table 2 shows the solubility of the polyimide with various compositions and the test results of the chemical resistance of the polyimide to solvents utilized in TFT processes (test condition: 50° C./1 hour).

Comparative Example 1

Preparation of 5-ring-BAPB(0.7)-BAPPm(0.3)

0.0044 mole of BAPPm

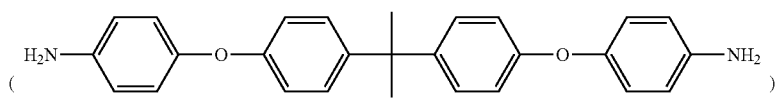

and 0.0103 mole of BAPB

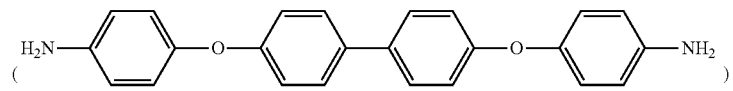 [SMILES: Nc1ccc(Oc2ccc(-c3ccc(Oc4ccc(N)cc4)cc3)cc2)cc1]

were completely dissolved in 35.03 g of m-cresol in a three-necked flask under nitrogen at room temperature. 0.0150 mole of 5-ring dianhydride

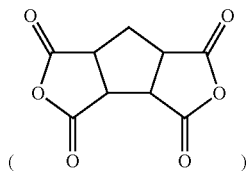

was then added to the flask. After 5-ring was completely dissolved, the resulting solution was continuously stirred for 1 hour to form a sticky poly(amic acid) (PAA) solution. Next, the PAA solution was heated to 220° C. to react for 3 hours. Water was simultaneously removed using a water remover during the aforesaid processes. Next, the reaction solution was dropped into methanol to precipitate silk polyimide. The polyimide was then baked in a vacuum oven for 12 hours. The silk polyimide was then dissolved in DMAc, with a solid content of 15%.

Comparative Example 2

Preparation of 6FDA-BAPB(0.7)-BAPPm(0.3)

0.0044 mole of BAPPm

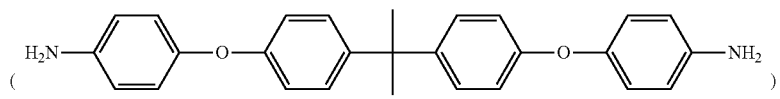

and 0.0103 mole of BAPB

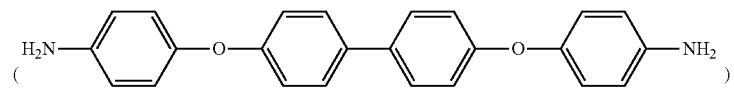 [SMILES: Nc1ccc(Oc2ccc(-c3ccc(Oc4ccc(N)cc4)cc3)cc2)cc1]

were completely dissolved in 49.04 g of m-cresol in a three-necked flask under nitrogen at room temperature. 0.0150 mole of 6FDA dianhydride

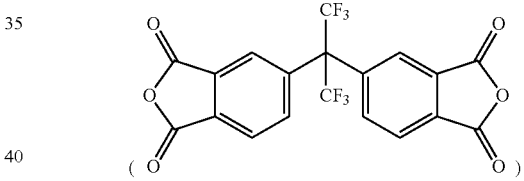

was then added to the flask. After 6FDA was completely dissolved, the resulting solution was continuously stirred for 1 hour to form a sticky poly(amic acid) (PAA) solution. Next, the PAA solution was heated to 220° C. to react for 3 hours. Water was simultaneously removed using a water remover during the aforesaid processes. Next, the reaction solution was dropped into methanol to precipitate silk polyimide. The polyimide was then baked in a vacuum oven for 12 hours. The silk polyimide was then dissolved in DMAc, with a solid content of 15%.

TABLE 3

| | Compositions | | | Solvent utilized in TFT processes | | | |
|---|---|---|---|---|---|---|---|
| No. | Dianhydride | Diamine | | solubility | Photoresist | Oxalic acid | Developer | Stripper |
| 1 | 5-ring | BAPB (0.7) | BAPPm (0.3) | ○ | X | ○ | ○ | X |
| 2 | 6FDA | BAPB (0.7) | BAPPm (0.3) | ○ | X | X | ○ | ○ |

The polyimide synthesized by polycyclic aliphatic dianhydride (5-ring and 6FDA) and diamine (BAPB (0.7) and BAPPm (0.3)) prepared from Comparative Examples 1 and 2 was further coated on a glass to form a polyimide film. Table 3 shows the solubility of the polyimide and the test results of the chemical resistance of the polyimide to solvent utilized in TFT processes (test condition: 50° C./1 hour).

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a flexible electrical device, comprising:
   providing a first substrate;
   providing a second substrate opposed to the first substrate, wherein one of the first and second substrates comprises a polyimide polymer of Formula (I):

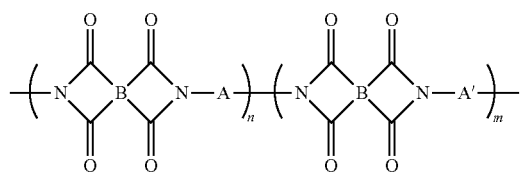
(I)

wherein when B is

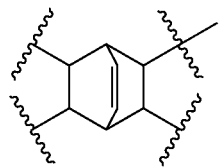

A is

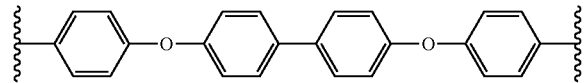

and A' is

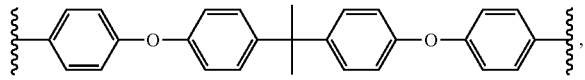

or when B is

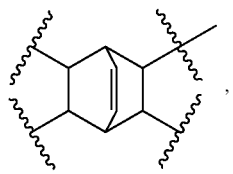 [SMILES: *C1C(*)C2C=CC1C(*)C2*]

A is

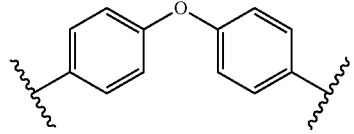 [SMILES: *c1ccc(Oc2ccc(*)cc2)cc1]

and A' is

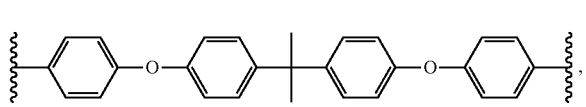 [SMILES: *c1ccc(Oc2ccc(C(C)(C)c3ccc(Oc4ccc(*)cc4)cc3)cc2)cc1]

and $1 \leq n, m \leq 4$;

directly fabricating a thin film transistor (TFT) on one of the first and second substrates which comprises the polyimide polymer of Formula (I); and disposing a medium layer between the first substrate and the second substrate.

2. The method for fabricating a flexible electrical device as claimed in claim 1, wherein the medium layer comprises liquid crystal or polymer.

3. The method for fabricating a flexible electrical device as claimed in claim 1, wherein the flexible electrical device comprises a particle display, liquid crystal display or micro electro mechanical system (MEMS) display.

4. The method for fabricating a flexible electrical device as claimed in claim 3, wherein the particle display comprises an electrochromic display (ECD) or electro-phoretic display (EPD).

5. The method for fabricating a flexible electrical device as claimed in claim 3, wherein the liquid crystal display comprises cholesteric liquid crystal display (ChLCD) or bistable twisted-nematic (TN) liquid crystal display.

6. The method for fabricating a flexible electrical device as claimed in claim 1, wherein the flexible electrical device comprises a solar cell.

* * * * *